(12) United States Patent
Chang et al.

(10) Patent No.: US 10,672,677 B2
(45) Date of Patent: Jun. 2, 2020

(54) SEMICONDUCTOR PACKAGE STRUCTURE

(71) Applicants: INDUSTRIAL TECHNOLOGY RESEARCH INSTITUTE, Hsinchu (TW); Win-House Electronic Co., Ltd., New Taipei (TW)

(72) Inventors: Jing-Yao Chang, New Taipei (TW); Tao-Chih Chang, Taoyuan (TW); Kuo-Shu Kao, Hsinchu (TW); Fang-Jun Leu, Taipei (TW); Hsin-Han Lin, Zhudong Township, Hsinchu County (TW); Chih-Ming Tzeng, Hsinchu (TW); Hsiao-Ming Chang, New Taipei (TW); Chih-Ming Shen, New Taipei (TW)

(73) Assignees: INDUSTRIAL TECHNOLOGY RESEARCH INSTITUTE, Hsinchu (TW); WIN-HOUSE ELECTRONIC CO., LTD., New Taipei (TW)

( * ) Notice: Subject to any disclaimer, the term of this patent is extended or adjusted under 35 U.S.C. 154(b) by 0 days.

(21) Appl. No.: 15/979,403

(22) Filed: May 14, 2018

(65) Prior Publication Data

US 2018/0261519 A1 Sep. 13, 2018

Related U.S. Application Data

(63) Continuation of application No. 15/146,878, filed on May 4, 2016, now abandoned.

(30) Foreign Application Priority Data

Dec. 1, 2015 (TW) .............................. 104140189 A

(51) Int. Cl.
H01L 23/31 (2006.01)
H01L 23/36 (2006.01)
(Continued)

(52) U.S. Cl.
CPC ...... H01L 23/3114 (2013.01); H01L 23/3185 (2013.01); H01L 23/36 (2013.01);
(Continued)

(58) Field of Classification Search
CPC . H01L 23/3114; H01L 24/00; H01L 23/3185; H01L 23/49844; H01L 23/49811;
(Continued)

(56) References Cited

U.S. PATENT DOCUMENTS 5,705,848 A 1/1998 Bayerer
6,979,843 B2 12/2005 Nakajima et al.
(Continued)

FOREIGN PATENT DOCUMENTS

CN 103515447 A 1/2014
JP 2001-110957 A 4/2001
(Continued)

OTHER PUBLICATIONS

Boyi Yang et al., "Advanced Low-Voltage Power MOSFET Technology for Power Supply in Package Applications", pp. 4202-4215, IEEE Transactions on Power Electronics, vol. 28, No. 9, Sep. 2013.
(Continued)

*Primary Examiner* — Bitew A Dinke
(74) *Attorney, Agent, or Firm* — Rabin & Berdo, P.C.

(57) ABSTRACT

A semiconductor package structure is provided. The semiconductor package structure includes a semiconductor chip, a guard ring, a gel layer, and a first lead frame. The guard ring is disposed on the semiconductor chip, and the gel layer is disposed on the guard ring. The first lead frame is electrically connected to the semiconductor chip, and the gel layer is located between the guard ring and the first lead frame.

20 Claims, 8 Drawing Sheets

Related U.S. Application Data

(60) Provisional application No. 62/220,280, filed on Sep. 18, 2015.

(51) Int. Cl.
*H01L 23/373* (2006.01)
*H01L 23/495* (2006.01)
*H01L 23/498* (2006.01)
*H01L 23/00* (2006.01)

(52) U.S. Cl.
CPC .... *H01L 23/3735* (2013.01); *H01L 23/49531* (2013.01); *H01L 23/49811* (2013.01); *H01L 23/49844* (2013.01); *H01L 24/00* (2013.01); H01L 23/3121 (2013.01); H01L 2224/371 (2013.01); H01L 2224/3754 (2013.01); H01L 2224/37124 (2013.01); H01L 2224/37147 (2013.01); H01L 2224/40 (2013.01); H01L 2224/40095 (2013.01); H01L 2224/40225 (2013.01); H01L 2224/48091 (2013.01); H01L 2224/48227 (2013.01); H01L 2224/73265 (2013.01); H01L 2924/00014 (2013.01); H01L 2924/1203 (2013.01); H01L 2924/13055 (2013.01); H01L 2924/13062 (2013.01); H01L 2924/13091 (2013.01); H01L 2924/181 (2013.01)

(58) Field of Classification Search
CPC ........... H01L 23/49531; H01L 23/3735; H01L 23/36; H01L 2224/371; H01L 2224/3754; H01L 2224/37147; H01L 2224/37124; H01L 23/3121; H01L 2224/73265; H01L 2224/48091; H01L 2224/40; H01L 2224/40095; H01L 2924/181
See application file for complete search history.

(56) References Cited

U.S. PATENT DOCUMENTS

| | | | |
|---|---|---|---|
| 7,285,849 B2 | 10/2007 | Cruz et al. | |
| 7,589,412 B2 | 9/2009 | Kashimoto et al. | |
| 7,671,467 B2 * | 3/2010 | Nonaka | H01L 23/057 |
| | | | 257/711 |
| 8,630,097 B2 | 1/2014 | Kim et al. | |
| 10,319,661 B2 * | 6/2019 | Nagamizu | H01L 23/36 |
| 2006/0175700 A1 * | 8/2006 | Kagii | H01L 21/52 |
| | | | 257/706 |
| 2006/0226532 A1 | 10/2006 | Satou et al. | |
| 2007/0001273 A1 | 1/2007 | Sato et al. | |
| 2008/0061431 A1 * | 3/2008 | Fujiwara | H01L 23/3735 |
| | | | 257/712 |
| 2008/0224315 A1 * | 9/2008 | Miyata | H01L 23/49524 |
| | | | 257/750 |
| 2008/0272472 A1 | 11/2008 | Hata et al. | |
| 2010/0187678 A1 | 7/2010 | Kajiwara et al. | |
| 2011/0012252 A1 | 1/2011 | Gao et al. | |
| 2011/0075451 A1 | 3/2011 | Bayerer et al. | |
| 2012/0104621 A1 | 5/2012 | Jang | |
| 2012/0306091 A1 | 12/2012 | Stolze et al. | |
| 2013/0134569 A1 | 5/2013 | Ha | |
| 2013/0161801 A1 | 6/2013 | Otremba et al. | |
| 2013/0241040 A1 * | 9/2013 | Tojo | H01L 23/051 |
| | | | 257/666 |
| 2013/0256856 A1 * | 10/2013 | Mahler | H01L 24/40 |
| | | | 257/676 |
| 2014/0035605 A1 | 2/2014 | Kurz et al. | |
| 2014/0042609 A1 * | 2/2014 | Nagaune | H01L 24/34 |
| | | | 257/692 |
| 2014/0048918 A1 * | 2/2014 | Nagaune | H01L 23/4334 |
| | | | 257/675 |
| 2014/0111956 A1 | 4/2014 | Taniguchi | |
| 2014/0117524 A1 * | 5/2014 | Kim | H01L 23/4334 |
| | | | 257/676 |
| 2014/0118956 A1 * | 5/2014 | Kim | H01L 23/049 |
| | | | 361/728 |
| 2014/0264383 A1 | 9/2014 | Kajiwara et al. | |
| 2014/0284624 A1 * | 9/2014 | Beer | H01L 23/564 |
| | | | 257/77 |
| 2015/0262814 A1 | 9/2015 | Plappert et al. | |
| 2015/0340307 A1 | 11/2015 | Gabler et al. | |
| 2016/0093525 A1 * | 3/2016 | Cook | H01L 21/4867 |
| | | | 257/676 |
| 2016/0099189 A1 * | 4/2016 | Khai Yen | H01L 23/4952 |
| | | | 257/676 |
| 2016/0104631 A1 | 4/2016 | Guth et al. | |
| 2017/0309496 A1 * | 10/2017 | Nakajima | H01L 24/24 |

FOREIGN PATENT DOCUMENTS

| | | | |
|---|---|---|---|
| JP | 2001110957 A | * | 4/2001 |
| TW | 200703677 A | | 1/2007 |
| TW | I296425 B | | 5/2008 |
| TW | 201140799 A | | 11/2011 |

OTHER PUBLICATIONS

Hsueh-Rong Chang et al., "300A 650V 70 um Thin IGBTs with Double-Sided Cooling", pp. 320-323, Proceedings of the 23rd International Symposium on Power Semiconductor Devices & IC's, May 23-26, 2011.

Yejun Zhu et al., "Thermal and Reliability Analysis of Clip Bonding Package Using High Thermal Conductivity Adhesive", pp. 259-263, 2013 IEEE 15th Electronics Packaging Technology Conference (EPTC 2013).

Martien Kengen et al., "Development of Matrix Clip Assembly for Power MOSFET Packages", pp. 1-4, Microelectronics and Packaging Conference, 2009. EMPC 2009.

Taiwanese Office Action dated Aug. 12, 2016.
Taiwanese Office Action dated Nov. 15, 2016.

* cited by examiner

SEMICONDUCTOR PACKAGE STRUCTURE

This is a Continuation of U.S. application Ser. No. 15/146,878, filed on May 4, 2016 which claims the benefits of U.S. provisional application Ser. No. 62/220,280, filed on Sep. 18, 2015 and Taiwan application Serial No. 104140189, filed on Dec. 1, 2015, the subject matters of which are incorporated herein by reference.

TECHNICAL FIELD

The technical field relates to a semiconductor package structure.

BACKGROUND

By power electronic technology, electricity can be changed and controlled under a sudden high voltage. In addition, digitization of power source control has become one of the future trends; therefore, power electronic technology has gradually become more and more important. Moreover, power component modules have great influence on the development of power electronic technology. The applications of power electronic technology play an important role in fields of such as new energy equipment, wind power generation, solar energy, electric vehicles, and green buildings. Furthermore, power electronic technology is also highly related to applications used in daily lives, such as high speed railways, smart grid systems, and home appliance with variable frequency.

Power component module package technology includes process integration of power component package electro-thermo simulation technology and power module system in package (SiP), die attach process, wire bonding process, and etc. Due to the continuous deceases of the sizes and thicknesses of power semiconductor chips along with the advance of technology, e.g. metal oxide semiconductor field effect transistors (MOSFET) with a size of 50 μm have been developed; in other words, packaging of thin-type chips is actually facing more severe tests. Therefore, industries have been working on developing power component module package technology for increasing package yields and reliability.

SUMMARY

The present disclosure relates in general to a semiconductor package structure. In the embodiments, the gel layer is located between the guard ring and the first lead frame, such that the electrical field effects around the guard ring can be lowered, a higher withstand voltage of the whole device can be further maintained, and the effects of protecting the semiconductor chip and supporting the whole structure can be achieved.

According to an embodiment, a semiconductor package structure is provided. The semiconductor package structure includes a semiconductor chip, a guard ring, a gel layer, and a first lead frame. The guard ring is disposed on the semiconductor chip, and the gel layer is disposed on the guard ring. The first lead frame is electrically connected to the semiconductor chip, and the gel layer is located between the guard ring and the first lead frame.

According to another embodiment, a semiconductor package structure is provided. The semiconductor package structure includes a semiconductor chip, a guard ring, a solder, a first lead frame, and a gel layer. The guard ring and the solder are disposed on the semiconductor chip. The first lead frame is electrically connected to the semiconductor chip through the solder. The gel layer is disposed on the semiconductor chip and located between the semiconductor chip and the first lead frame, and a height of the gel layer is equal to or larger than a height of the solder.

The following description is made with reference to the accompanying drawings and embodiments.

DETAILED DESCRIPTION

In the embodiments of the present disclosure, the gel layer is located between the guard ring and the first lead frame, such that the electrical field effects around the guard ring can be lowered, a higher withstand voltage of the whole device can be further maintained, and the effects of protecting the semiconductor chip and supporting the whole structure can be achieved. Details of embodiments of the present disclosure are described hereinafter with accompanying drawings. Specific structures and compositions disclosed in the embodiments are for examples and for explaining the disclosure only and are not to be construed as limitations. A person having ordinary skill in the art may modify or change corresponding structures and compositions of the embodiments according to actual applications.

Figure 1A:
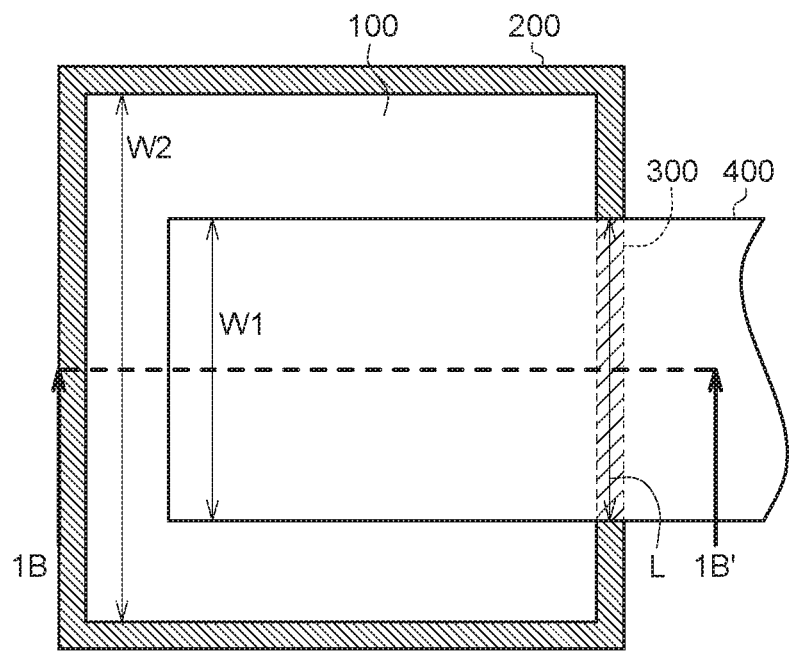
FIG. 1A is a top view of a semiconductor package structure according to an embodiment of the present disclosure.
Figure 1B:
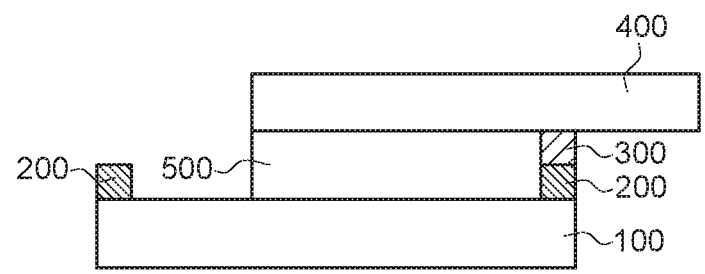
FIG. 1B is a cross-sectional view along the cross-section line 1B-1B' in FIG. 1A.

FIG. 1A is a top view of a semiconductor package structure according to an embodiment of the present disclosure, and FIG. 1B is a cross-sectional view along the cross-section line 1B-1B' in FIG. 1A. As shown in FIGS. 1A-1B, the semiconductor package structure 10 includes a semiconductor chip 100, a guard ring 200, a gel layer 300, and a first lead frame 400. The guard ring 200 is disposed on a first surface of the semiconductor chip 100, and the gel layer 300 is disposed on the guard ring 200. The first lead frame 400 is electrically connected to the semiconductor chip 100, and the gel layer 300 is located between the guard ring 200 and the first lead frame 400.

In a common manufacturing process, the semiconductor chip is electrically connected usually by a wire bonding process, such that the contact area between the wire(s) and the chip is relatively small; the wire diameter is, for example, about 280-380 μm, and this wire diameter contributes to the contact area of the contact point between the bonding wire(s) and the chip. When the contact area is too small, not only is the heat dissipation of the semiconductor chip rendered non-uniform, but current is also located only in local regions, such as the wire(s) and the contact points between the wire and the chip; accordingly, the current density would be too high in local regions of the device, and heat dissipation of wire(s) would be poorer. In contrast, according to the embodiments of the present disclosure, the semiconductor chip 100 is electrically connected to the first lead frame 400, and the welding area between the first lead frame 400 and the semiconductor chip 100 is relatively large; such large contact area not only can result in faster and more uniform heat dissipation but also can reduce current density, reduced current density can make both electric resistance and thermal resistance reduce, such that uniform temperature and uniform current of the device can be achieved, and thus the performance as well as the stability of the whole device can be further improved.

In addition, according to the embodiments of the present disclosure, the gel layer 300 is located between the guard ring 200 and the first lead frame 400, such that the electrical field effects around the guard ring 200 can be lowered, a higher withstand voltage of the whole device can be further maintained, and the effects of protecting the semiconductor chip 100 and supporting the whole structure can be achieved. Moreover, the formation of the gel layer 300 requires only an extra adhesive dripping process without introducing or developing any new manufacturing process; as such, existing semiconductor manufacturing processes can be adopted and easily adjusted according to various semiconductor chips 100 having different sizes or shapes, effects of supporting the first lead frame 400 from inclination can be achieved, and the properties of current transmission and heat transmission can be further enhanced.

In some embodiments, the semiconductor chip 100 may be a metal oxide semiconductor field effect transistor (MOSFET), an insulated gate bipolar transistor (IGBT), a junction field effect transistor (JFET), or a diode.

In the embodiment, the gel layer 300 is made of an insulating material, such as including least one of silicone gel and epoxy resin.

As shown in FIGS. 1A-1B, in the embodiment, the semiconductor package structure 10 may further include a solder 500. The solder 500 is disposed on the semiconductor chip 100, and the semiconductor chip 100 is electrically connected to the first lead frame 400 through the solder 500.

In the embodiment, the material of the solder 500 may include at least one of a lead-free solder, a dual-phase solid-liquid interdiffusion (SLID) bonding, a high-lead solder, and a nano-sized silver sintered material.

As shown in FIG. 1A, in the embodiment, the first lead frame 400 has a first width W1, a partial region of the semiconductor chip 100 is non-overlapped with each of the guard ring 200, the gel layer 300 and the solder 500 in a normal direction of the first surface of the semiconductor chip 100, and is exposed from the guard ring 200. The partial region of the semiconductor chip 100 has a second width W2 along the direction of the first width W1, and the first width W1 is about 40-100% of the second width W2. For example, the semiconductor chip 100 has a total width of about 3 mm along the first width W1, the guard ring 200 has a width of about 30-700 μm, and the first width W1 is about 2.3-2.97 mm.

In the embodiment, the material of the first lead frame 400 is such as a conductive metal. For example, the first lead frame 400 may include copper, aluminum with its surface coated with nickel, or iron.

As shown in FIG. 1A, the gel layer 300 has a length L along the direction of the first width W1. In some embodiments, the length L is equal to or smaller than the first width W1, such that the first lead frame 400 and the guard ring 200 can be completely separated by the gel layer 300. In the embodiment as shown in FIG. 1A, the length L, which extends along the guard ring 200, of the gel layer 300 is substantially equal to the first width W1 of the first lead frame 400. In another embodiment, the length L of the gel layer 300 may be smaller than the first width W1 of the first lead frame 400 (not shown in drawings).

Figure 2A:
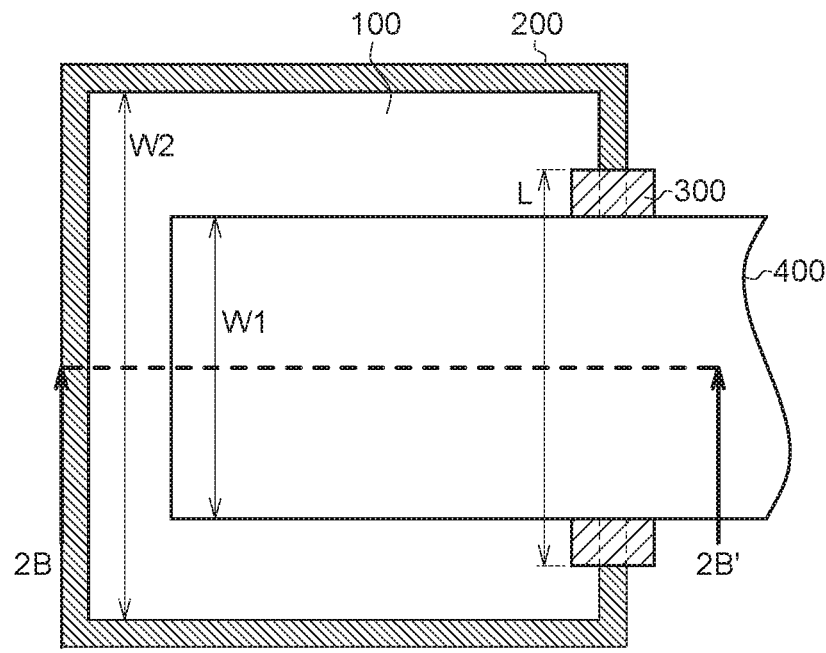
FIG. 2A is a top view of a semiconductor package structure according to another embodiment of the present disclosure.
Figure 2B:
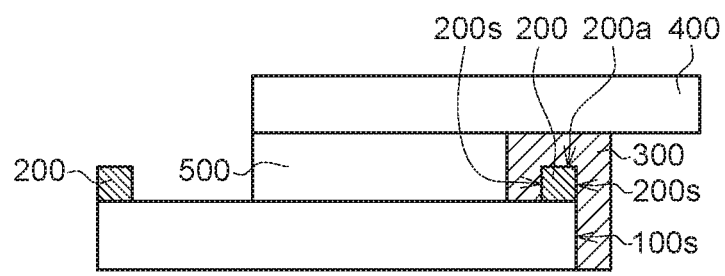
FIG. 2B is a cross-sectional view along the cross-section line 2B-2B' in FIG. 2A.

FIG. 2A is a top view of a semiconductor package structure according to another embodiment of the present disclosure, and FIG. 2B is a cross-sectional view along the cross-section line 2B-2B' in FIG. 2A. The elements in the present embodiment sharing similar or the same labels with those in the previous embodiment are similar or the same elements, and the description of which is omitted. The present embodiment is different from the embodiment as shown in FIGS. 1A-1B mainly in the design of the gel layer 300.

In the embodiment as shown in FIGS. 2A-2B, the gel layer 300 of the semiconductor package structure 20 covers a side surface 200s of the guard ring 200 and a side surface 100s of the semiconductor chip 100.

According to the embodiments of the present disclosure, the gel layer 300 covers the side surface 200s of the guard ring 200 and the side surface 100s of the semiconductor chip 100, such that the solder under the semiconductor chip 100 can be prevented from being pushed toward the side surface 100s of the semiconductor chip 100, bridging short circuit between the solder 500 above the semiconductor chip 100 and the solder below the chip can be prevented, and the solder 500 or the first lead frame 400 can be prevented from being too close to or contacting the guard ring 200 influencing the operation functions of the semiconductor chip 100. Accordingly, the issue of the solder 500 and/or the solder below the chip contacting the side surface 100s of the semiconductor chip 100 and the issue of bridging connection can be improved, and the welding area and the solder height between the solder 500 and the first lead frame 400 above the semiconductor chip 100 can be further adjusted.

In the embodiment, as shown in FIGS. 2A-1B, the length L, which extends along the guard ring 200, of the gel layer 300 is larger than the first width W1 of the first lead frame 400, such that the first lead frame 400 and the guard ring 200 can be completely separated by the gel layer 300. In addition, the gel layer 300 covers the top surface 200a and the two side surfaces 200s of the guard ring 200 within the extending range of the length L.

Figure 3A:
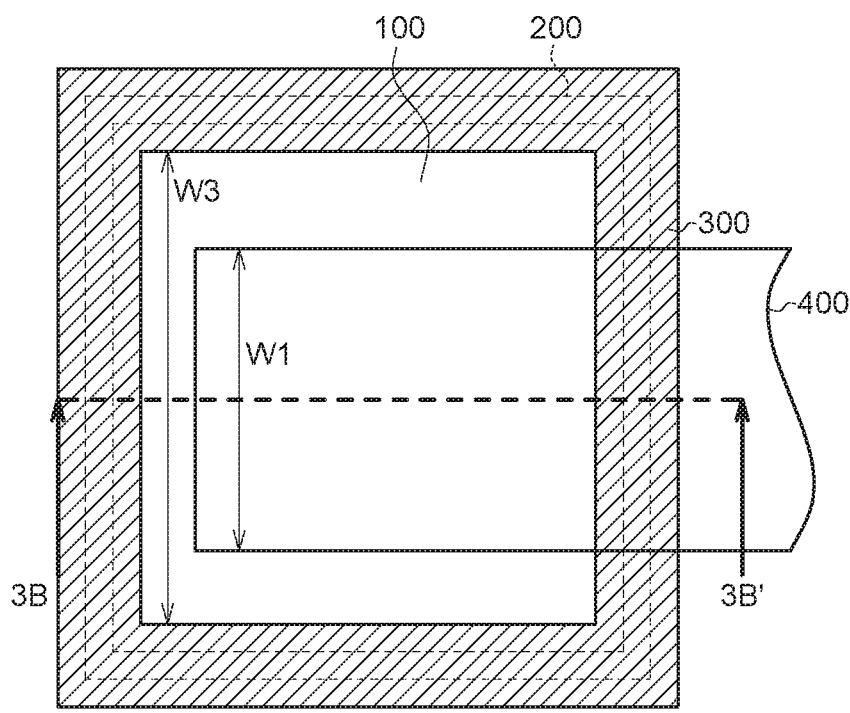
FIG. 3A is a top view of a semiconductor package structure according to an additional embodiment of the present disclosure.
Figure 3B:
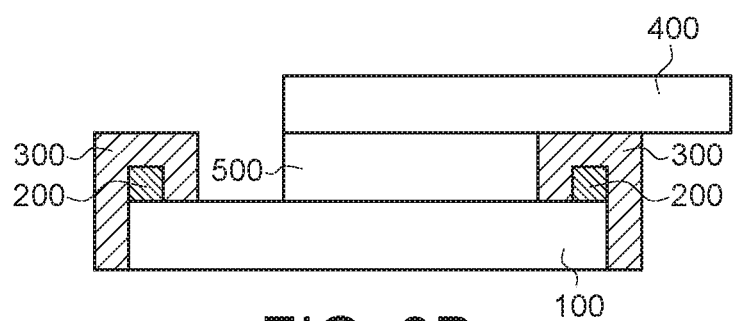
FIG. 3B is a cross-sectional view along the cross-section line 3B-3B' in FIG. 3A.

FIG. 3A is a top view of a semiconductor package structure according to an additional embodiment of the present disclosure, and FIG. 3B is a cross-sectional view along the cross-section line 3B-3B' in FIG. 3A. The elements in the present embodiment sharing similar or the same labels with those in the previous embodiment are similar or the same elements, and the description of which is omitted. The present embodiment is different from the previous embodiments mainly in the design of the gel layer 300.

In the embodiment as shown in FIGS. 3A-3B, the gel layer 300 of the semiconductor package structure 30 fully covers the guard ring 200. The gel layer 300 made of an insulating material fully covers the guard ring 200 and the semiconductor chip 100, such that the problem of the solder 500 being pushed toward the side of the semiconductor chip 100 can be solved, the problem of bridging short circuit between the solder 500 above the semiconductor chip 100 and the solder below the chip can be solved, and the solder 500 or the first lead frame 400 can be prevented from being too close to or contacting the guard ring 200 influencing the electrical properties. Accordingly, the welding areas of the solder 500 and/or the solder below the chip of the semiconductor chip 100 can be effectively controlled, the solder flowing issue of the semiconductor chip 100 can be controlled as well, and the package yields and the reliability can be largely improved.

As shown in FIG. 3A, a region of the semiconductor chip 100 is exposed from the gel layer 300 and has a third width W3 along the direction of the first width W1. In some embodiments, the first width W1 is equal to or smaller than the third width W3. In the embodiment as shown in FIG. 3A, the first width W1 is smaller than the third width W3. In another embodiment, the first width W1 may be equal to the third width W3 (not shown in drawings).

Figure 4A:
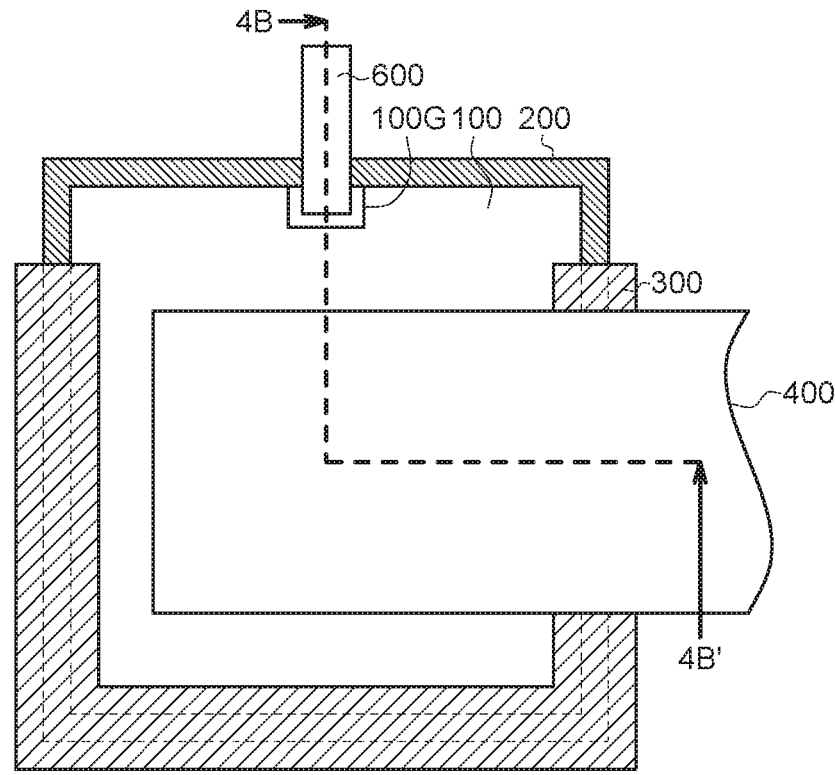
FIG. 4A is a top view of a semiconductor package structure according to a further embodiment of the present disclosure.
Figure 4B:
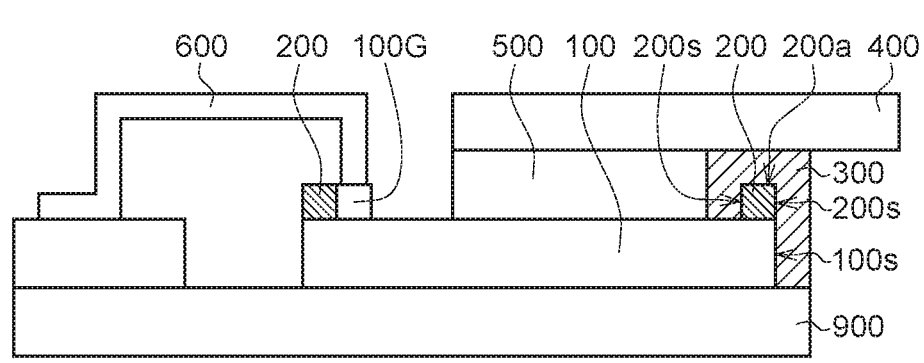
FIG. 4B is a cross-sectional view along the cross-section line 4B-4B' in FIG. 4A.

FIG. 4A is a top view of a semiconductor package structure according to a further embodiment of the present disclosure, and FIG. 4B is a cross-sectional view along the cross-section line 4B-4B' in FIG. 4A. The elements in the present embodiment sharing similar or the same labels with those in the previous embodiment are similar or the same elements, and the description of which is omitted.

In the embodiment as shown in FIGS. 4A-4B, the semiconductor package structure 40 further includes a substrate 900 and a second lead frame 600. A gate contact 100G of the semiconductor chip 100 is electrically connected to the substrate 900 through the second lead frame 600.

In the embodiment, the semiconductor chip 100 is such as a MOSFET or an IGBT, the semiconductor package structure 40 may further include an additional lead frame (not shown in drawings), and an emitter contact of the semiconductor chip 100 may be electrically connected to the substrate 900 through the additional lead frame.

In the embodiment, the substrate 900 is such as a direct plated copper (DPC) substrate, a direct bonded copper (DBC) substrate, a metal substrate, or a PCB substrate, and the material of the metal substrate may include copper, aluminum, or stainless steel. The substrate 900 may have a single-layered structure or a multi-layered structure.

Figure 5:
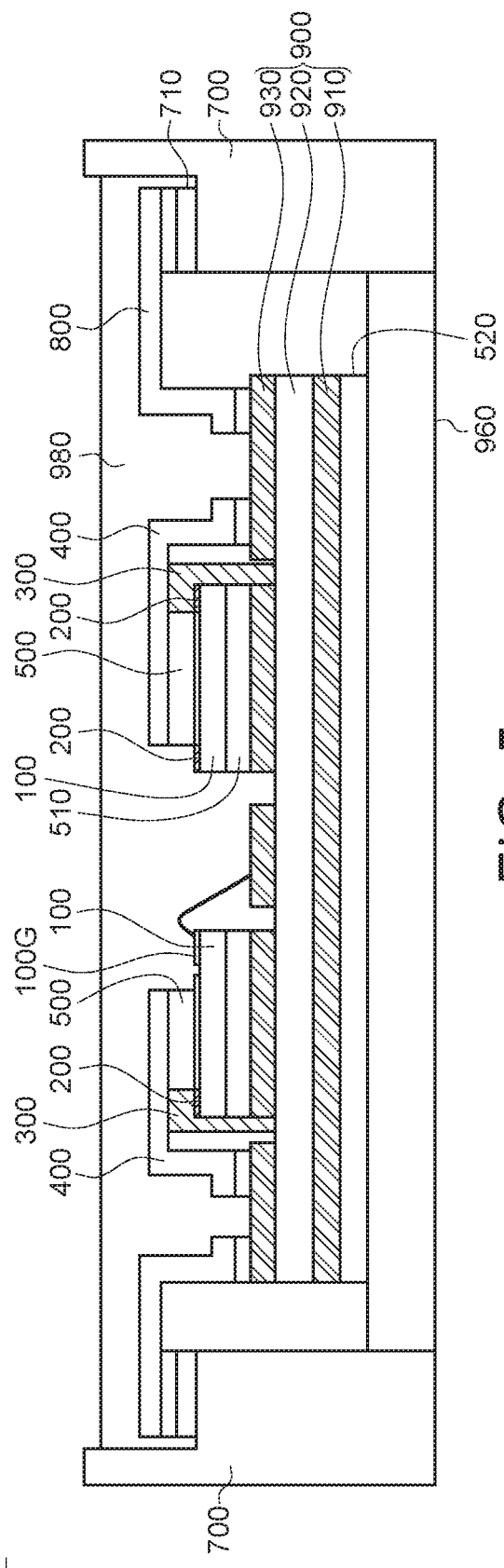
FIG. 5 is a schematic view of a semiconductor package structure according to still further embodiment of the present disclosure.

FIG. 5 is a schematic view of a semiconductor package structure according to still further embodiment of the present disclosure. The elements in the present embodiment sharing similar or the same labels with those in the previous embodiment are similar or the same elements, and the description of which is omitted.

In the embodiment as shown in FIG. 5, the semiconductor package structure 50 may further include a substrate 900, a housing 700, an electrode layer 710, and a third lead frame 800. The housing 700 is for accommodating the substrate 900 and the semiconductor chip 100. The electrode layer 710 is disposed on the housing 700, and the substrate 900 is electrically connected to the electrode layer 710 on the housing 700 through the third lead frame 800.

In the embodiment, the substrate 900 is such as a multi-layered structure, including a metal layer 910, a ceramic layer 920, and a patterned metal layer 930, and the semiconductor chip 100 is connected to the patterned metal layer 930 through a solder 510. In addition, the semiconductor package structure 50 may further optionally include a base 960, and the substrate 900 is disposed on the base 960 through a solder 520. The base 960 is such as a metal substrate, of which the material may include copper, aluminum, or stainless steel.

Figure 6:
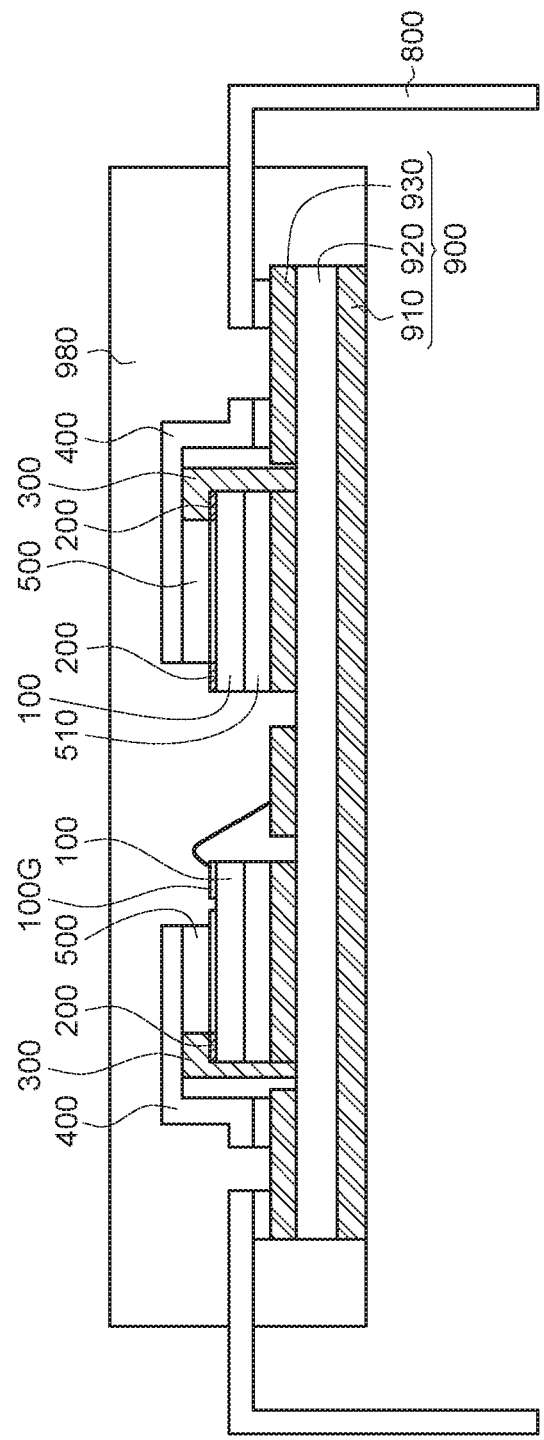
FIG. 6 is a schematic view of a semiconductor package structure according to another further embodiment of the present disclosure.

FIG. 6 is a schematic view of a semiconductor package structure according to another further embodiment of the present disclosure. The elements in the present embodiment sharing similar or the same labels with those in the previous embodiment are similar or the same elements, and the description of which is omitted.

In the embodiment as shown in FIG. 6, in the semiconductor package structure 60, the substrate 900 is electrically connected to an external power source (not shown in drawings) through the third lead frame 800.

Moreover, as shown in FIG. 6, in the embodiment, the semiconductor package structure 60 may further include an encapsulation layer 980. The encapsulation layer 980 covers the semiconductor chip 100, the guard ring 200, the gel layer 300, the first lead frame 400, and a portion of the third lead frame 800.

Figure 7:
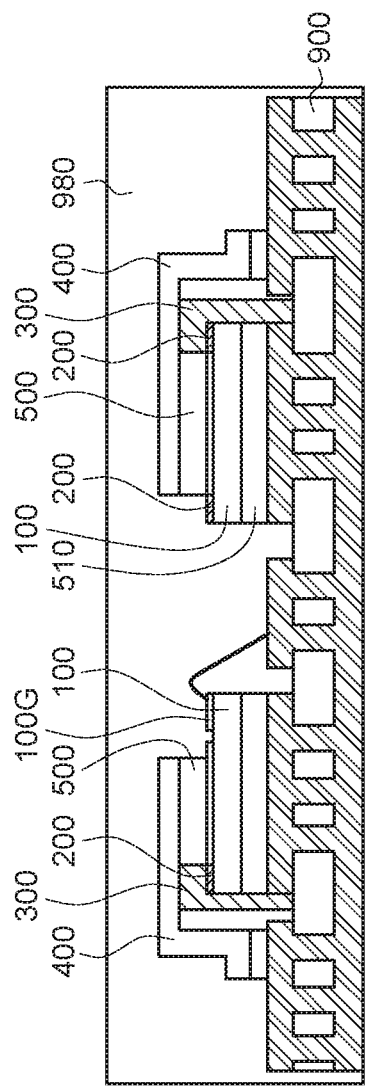
FIG. 7 is a schematic view of a semiconductor package structure according to an additional further embodiment of the present disclosure.

FIG. 7 is a schematic view of a semiconductor package structure according to an additional further embodiment of the present disclosure. The elements in the present embodiment sharing similar or the same labels with those in the previous embodiment are similar or the same elements, and the description of which is omitted.

In the embodiment as shown in FIG. 7, the substrate 900 of the semiconductor package structure 70 is a PCB substrate.

Figure 8A:
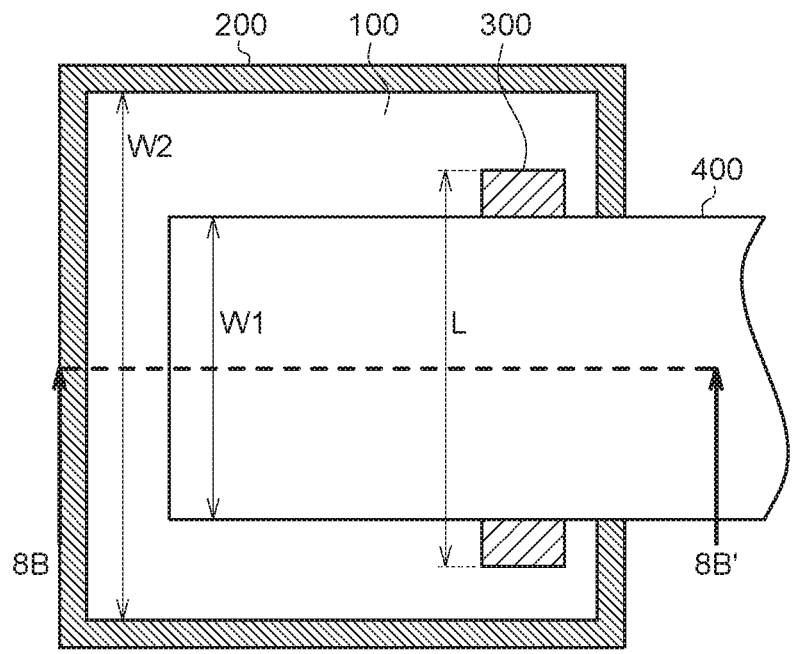
FIG. 8A is a top view of a semiconductor package structure according to a yet still further embodiment of the present disclosure.
Figure 8B:
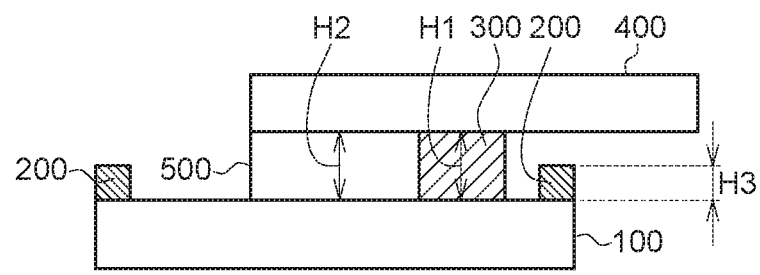
FIG. 8B is a cross-sectional view along the cross-section line 8B-8B' in FIG. 8A.

FIG. 8A is a top view of a semiconductor package structure according to a yet still further embodiment of the present disclosure, and FIG. 8B is a cross-sectional view along the cross-section line 8B-8B' in FIG. 8A. The elements in the present embodiment sharing similar or the same labels with those in the previous embodiment are similar or the same elements, and the description of which is omitted. The present embodiment is different from the embodiment as shown in FIGS. 1A-1B mainly in the design of the gel layer 300.

As shown in FIGS. 8A-8B, the semiconductor package structure 80 includes a semiconductor chip 100, a guard ring 200, a solder 500, a first lead frame 400, and a gel layer 300. The guard ring 200 and the solder 500 are disposed on the semiconductor chip 100. The first lead frame 400 is electrically connected to the semiconductor chip 100 through the solder 500. The gel layer 300 is disposed on the semiconductor chip 100 and located between the semiconductor chip 100 and the first lead frame 400. In some embodiments, a height H1 of the gel layer 300 is such as equal to or larger than a height H2 of the solder 500.

In the embodiment as shown in FIGS. 8A-8B, the height H1 of the gel layer 300 is substantially equal to the height H2 of the solder 500. In another embodiment, the height H1 of the gel layer may be larger than the height H2 of the solder 500 (not shown in drawings). Furthermore, in the embodiment as shown in FIGS. 8A-8B, the height H1 of the gel layer 300 is larger than a height H3 of the guard ring 200.

In the embodiment, as shown in FIGS. 8A-8B, the gel layer 300 is located between the guard ring 200 and the solder 500.

In some embodiments, a length L of the gel layer 300 may be equal to, smaller than, or larger than a first width W1 of the first lead frame 400. As shown in FIG. 8A, in the present embodiment, the length L of the gel layer 300 is larger than the first width W1 of the first lead frame 400.

As shown in FIGS. 8A-8B, in the embodiment, the guard ring 200, the gel layer 300, and the solder 500 are separated from one another. In some embodiments, the guard ring 200 may contact the gel layer 300, the gel layer 300 may contact the solder 500, or the three of the guard ring 200, the gel layer 300, and the solder 500 contact one another (not shown in drawings).

It is to be noted that the structural arrangements of the substrate 900, the housing 700, the electrode layer 710, the third lead frame 800, the solders 510 and 520, and the encapsulation layer 980, as shown in the embodiments of FIGS. 5-7, and the structural arrangements as shown in the embodiments of FIGS. 1A-4B and 8A-8B may be interchanged, combined, and/or modified according to actual needs, generating additional embodiments of the present disclosure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package structure, comprising:
   a semiconductor chip having a first surface;
   a guard ring disposed on the first surface of the semiconductor chip;
   a solder disposed on the first surface of the semiconductor chip;
   a first lead frame having a first width, electrically connected to the semiconductor chip through the solder;
   a gel layer disposed in a space between the semiconductor chip and the first lead frame where the semiconductor chip and the first lead frame are overlapped in a normal direction of the first surface of the semiconductor chip, such that the first lead frame is raised by the gel layer to separate the first lead frame from the guard ring; and
   an encapsulation layer covering the guard ring, the gel layer and the first lead frame;
   wherein a partial region of the semiconductor chip is non-overlapped with each of the guard ring, the gel layer and the solder in a normal direction of the first surface of the semiconductor chip, and the partial region has a second width along the direction of the first width, and the first width is 40-100% of the second width.

2. A semiconductor package structure, comprising:
   a semiconductor chip having a first surface;
   a guard ring disposed on the first surface of the semiconductor chip;
   a solder disposed on the first surface of the semiconductor chip;
   a first lead frame having a first width, electrically connected to the semiconductor chip through the solder; and
   a gel layer disposed in a space between the semiconductor chip and the first lead frame where the semiconductor chip and the first lead frame are overlapped in a normal direction of the first surface of the semiconductor chip, such that the first lead frame is raised by the gel layer to separate the first lead frame from the guard ring;
   wherein a partial region of the semiconductor chip is non-overlapped with each of the guard ring, the gel layer and the solder in a normal direction of the first surface of the semiconductor chip, and the partial region has a second width along the direction of the first width, and the first width is 40-100% of the second width.

3. The semiconductor package structure according to claim 2, wherein the gel layer is located between the guard ring and the first lead frame.

4. The semiconductor package structure according to claim 2, wherein the gel layer covers a side surface of the guard ring and a side surface of the semiconductor chip.

5. The semiconductor package structure according to claim 2, wherein the gel layer fully covers the guard ring.

6. The semiconductor package structure according to claim 2, wherein the gel layer comprises at least one of silicone gel and epoxy resin.

7. The semiconductor package structure according to claim 2, wherein the semiconductor chip is a metal oxide semiconductor field effect transistor (MOSFET), an insulated gate bipolar transistor (IGBT), a junction field effect transistor (JFET), or a diode.

8. The semiconductor package structure according to claim 7, wherein the solder comprises at least one of a lead-free solder, a dual-phase solid-liquid interdiffusion (SLID) bonding, a high-lead solder, and a nano-sized silver sintered material.

9. The semiconductor package structure according to claim 2, further comprising:
   a substrate; and
   a second lead frame, wherein a gate contact of the semiconductor chip is electrically connected to the substrate through the second lead frame.

10. The semiconductor package structure according to claim 2, further comprising:
    a substrate;
    a housing for accommodating the substrate and the semiconductor chip;
    an electrode layer disposed on the housing; and
    a third lead frame, wherein the substrate is electrically connected to the electrode layer on the housing through the third lead frame.

11. The semiconductor package structure according to claim 2, further comprising:
    a substrate; and
    a third lead frame, wherein the substrate is electrically connected to an external power source through the third lead frame.

12. The semiconductor package structure according to claim 2, wherein a height of the gel layer is equal to or larger than a height of the solder.

13. The semiconductor package structure according to claim 12, wherein the gel layer is located between the guard ring and the solder.

14. A semiconductor package structure, comprising:
    a semiconductor chip having a first surface;
    a guard ring disposed on the first surface of the semiconductor chip;
    a solder disposed on the first surface of the semiconductor chip;
    a first lead frame having a first width and a second surface being faced to the first surface of the semiconductor chip and with a shortest distance to the first surface of the semiconductor chip, electrically connected to the semiconductor chip through the solder; and a gel layer disposed in a space between the first surface and the second surface, such that the first lead frame and the guard ring are separated by the gel layer;

wherein a partial region of the semiconductor chip is non-overlapped with each of the guard ring, the gel layer and the solder in a normal direction of the first surface of the semiconductor chip, and the partial region has a second width along the direction of the first width, and the first width is 40-100% of the second width.

15. The semiconductor package structure according to claim 14, wherein a top surface of the gel layer contacts the second surface of the first lead frame, and a bottom surface of the gel layer contacts the guard ring.

16. The semiconductor package structure according to claim 14, wherein the gel layer covers a side surface of the guard ring and a side surface of the semiconductor chip.

17. The semiconductor package structure according to claim 14, wherein the gel layer fully covers the guard ring.

18. The semiconductor package structure according to claim 14, wherein the gel layer comprises at least one of silicone gel and epoxy resin.

19. The semiconductor package structure according to claim 14, wherein the semiconductor chip is a metal oxide semiconductor field effect transistor (MOSFET), an insulated gate bipolar transistor (IGBT), a junction field effect transistor (JFET), or a diode.

20. The semiconductor package structure according to claim 14, wherein the solder comprises at least one of a lead-free solder, a dual-phase solid-liquid interdiffusion (SLID) bonding, a high-lead solder, and a nano-sized silver sintered material.

* * * * *